United States Patent
Cheng et al.

(10) Patent No.: US 8,927,363 B2
(45) Date of Patent: Jan. 6, 2015

(54) INTEGRATING CHANNEL SIGE INTO PFET STRUCTURES

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/896,968

(22) Filed: May 17, 2013

(65) Prior Publication Data

US 2014/0339638 A1    Nov. 20, 2014

(51) Int. Cl.
*H01L 21/8238* (2006.01)
*H01L 27/12* (2006.01)

(52) U.S. Cl.
CPC ........ *H01L 27/1203* (2013.01); *H01L 21/8238* (2013.01)
USPC ........... 438/222; 438/149; 438/166; 438/197; 438/217

(58) Field of Classification Search
USPC ......... 438/149, 150, 166, 197, 199, 217, 222, 438/229
See application file for complete search history.

(56) References Cited

U.S. PATENT DOCUMENTS

| | | | |
|---|---|---|---|
| 6,764,908 B1 * | 7/2004 | Kadosh et al. | 438/285 |
| 6,855,642 B2 * | 2/2005 | Tanabe et al. | 438/773 |
| 6,939,751 B2 | 9/2005 | Zhu | |
| 7,037,770 B2 * | 5/2006 | Chidambarrao et al. | 438/154 |
| 7,060,539 B2 | 6/2006 | Chidambarrao | |
| 7,208,354 B2 | 4/2007 | Bauer | |
| 7,709,350 B2 | 5/2010 | Komatsubara | |

(Continued)

FOREIGN PATENT DOCUMENTS

JP    2012231165 A    5/2012

OTHER PUBLICATIONS

C. Menon, et al., "High Quality SiGe Epitaxial Layer Grown by RPCVD Using Dichlorosilane," ASDAM 2000, Third International EuroConference on Advanced Semiconductor Devices and Microsystems, Oct. 2000, pp. 201-204, Royal Institute of Technology (KTH), Sweden.

(Continued)

*Primary Examiner* — Thanh V Pham
(74) *Attorney, Agent, or Firm* — Daniel P. Morris, Esq.; Otterstedt, Ellenbogen & Kammer, LLP

(57) ABSTRACT

A structure including nFET and pFET devices is fabricated by depositing a germanium-containing layer on a crystalline silicon layer. The crystalline silicon layer is converted to silicon germanium in the pFET region to provide a thin silicon germanium channel for the pFET device fabricated thereon. Silicon trench isolation is provided subsequent to deposition of the germanium-containing layer. There is substantially no thickness variation in the silicon germanium layer across the pFET device width. Electrical degradation near the shallow trench isolation region bounding the pFET device is accordingly avoided. Shallow trench isolation may be provided prior to or after conversion of the silicon layer to silicon germanium in the pFET region. The germanium-containing layer is removed from the nFET region so that an nFET device can be formed on the crystalline silicon layer.

17 Claims, 15 Drawing Sheets

(56) References Cited

U.S. PATENT DOCUMENTS

| | | |
|---|---|---|
| 8,062,951 B2 | 11/2011 | Chen |
| 8,110,486 B2 | 2/2012 | Matsumoto |
| 8,232,153 B2 | 7/2012 | Chidambarrao |
| 8,298,882 B2 | 10/2012 | Cheng |
| 2004/0150042 A1* | 8/2004 | Yeo et al. ............... 257/347 |
| 2006/0244097 A1* | 11/2006 | Wasshuber ............. 257/510 |
| 2010/0047977 A1 | 2/2010 | Clifton |
| 2012/0299155 A1 | 11/2012 | Liu |
| 2013/0029478 A1 | 1/2013 | Zhang |

OTHER PUBLICATIONS

J.F. Damlencourt, et al., "Fabrication of SiGe-On-Insulator by Improved Ge Condensation Technique," IEEE Conference Digest of the Third International Silicon Germanium Technology and Device Meeting (ISTDM 2006), May 2006, pp. 1-2, Princeton, NJ.

* cited by examiner

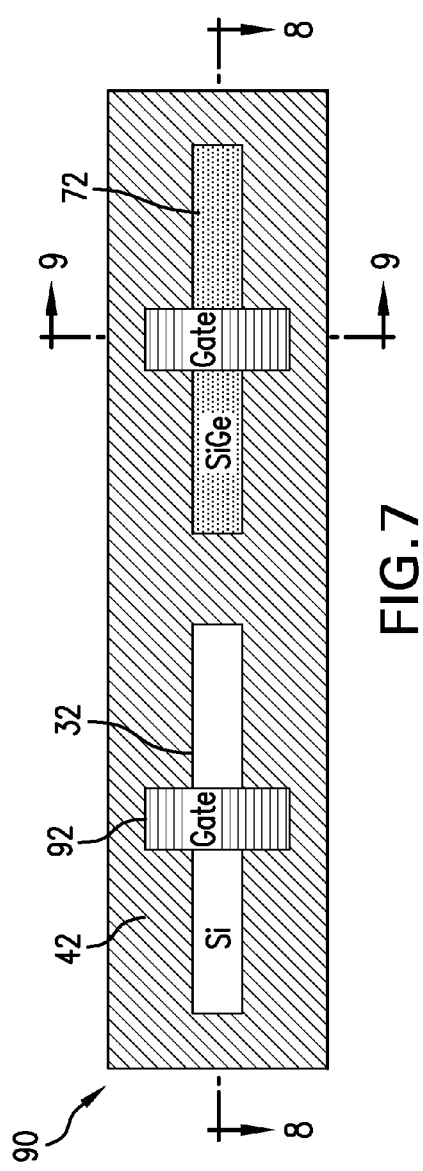
FIG. 7
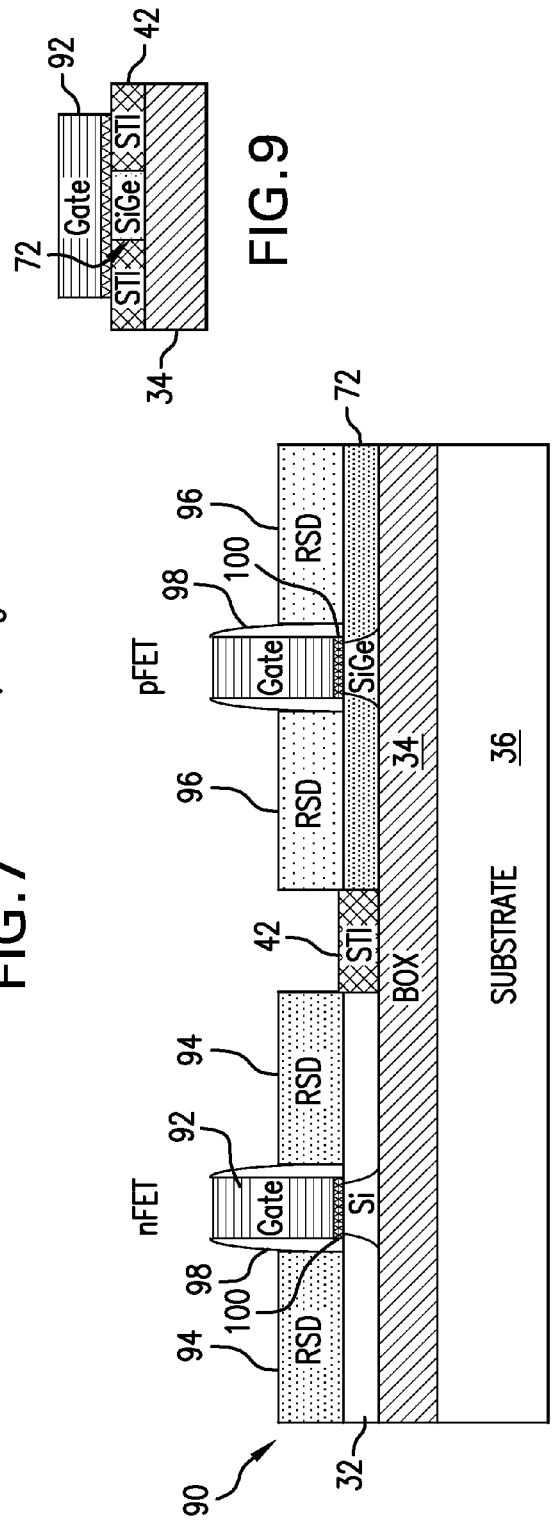
FIG. 9
FIG. 8

US 8,927,363 B2

INTEGRATING CHANNEL SIGE INTO PFET STRUCTURES

FIELD

The present disclosure relates to the physical sciences, and, more particularly, to field effect transistor (FET) structures and methods of fabrication thereof.

BACKGROUND

Trench-isolated field effect transistor devices are useful for applications including switching, voltage stabilization, signal modulation and other functions. Integrated circuit devices may include large numbers of such transistor devices on a single chip. IC Chips may be formed on wafers using conventional semiconductor fabrication processes including deposition, doping, photolithography and etching. Shallow trench isolation (STI) is a process used in semiconductor fabrication for isolating FET structures. It generally involves forming trenches around FET structures, for example by etching the substrates on which the FET structures are formed, and filling the trenches with an insulating material such as amorphous silicon dioxide. Typical steps involved in STI include oxidation, nitride deposition, lithography based patterning, reactive ion etching of the stack down to an insulating (e.g. buried oxide) layer, edge oxidation, liner deposition, fill deposition and chemical mechanical polish. The STI trenches electrically isolate the FET structures from neighboring FET structures on the chip or wafer. The areas within the trenches are referred to as "active silicon regions" or "RX". The FET structures are located on the active silicon regions.

Extremely thin semiconductor on insulator (ETSOI) wafers are useful alternatives to bulk silicon for fabricating CMOS devices. SOI wafers are characterized by a thin layer of semiconductor material, often crystalline silicon, grown epitaxially on an oxide layer that functions as an insulating layer. The SOI layer of an ETSOI substrate lacks intrinsic charge carriers and is characterized as fully depleted (FD). In other words, the majority carriers are fully depleted during operation. FDSOI transistors are characterized by shallow channels that can facilitate switching.

Channels comprising silicon germanium (SiGe) may facilitate performance of FDSOI pFET structures. In conventional CMOS fabrication flow, SiGe is epitaxially grown after STI on the crystalline silicon layer of an ETSOI substrate followed by thermal annealing or condensation to convert the SiGe/Si bi-layer into a SiGe layer that forms a channel for a pFET structure. During formation of the SiGe channel, a hard mask is employed to cover the portion of the crystalline silicon of the ETSOI substrate that is used for nFET structure fabrication. A nitride hard mask is often employed. Such a mask may be deposited using a conventional deposition such as spin-on coating, CVD, plasma-assisted CVD, or other known techniques. Epitaxial growth of the SiGe layer as described above results in a non-uniform SiGe channel thickness that may adversely affect performance, particularly of devices with narrow width (for example, below 100 nm) devices. Specifically, the SiGe layer is thinner at the RX edge due to faceted epitaxy at the STI/RX junction.

Scaling of fully depleted CMOS technology, particularly thin SOI devices, is facilitated by raised source/drain (S/D) regions to lower the external resistance. Epitaxial raised source and drain regions are formed on the semiconductor layers of SOI substrates. The thickness of an extremely thin silicon on insulator (ETSOI) layer on which raised source/drain regions may be grown typically ranges from 3 nm to 20 nm.

SUMMARY

Principles of the present disclosure provide an exemplary fabrication method that includes obtaining a semiconductor on insulator substrate comprising a crystalline silicon layer, epitaxially growing a layer comprising germanium on the crystalline silicon layer, forming a silicon trench isolation region on the substrate subsequent to epitaxially growing the layer comprising germanium, and removing a portion of the layer comprising germanium from the crystalline silicon layer. A first region is thereby formed wherein the semiconductor layer is uncovered by the layer comprising germanium. A second region is comprised of the semiconductor layer covered by the layer comprising germanium The method further includes a silicon germanium layer in the second region from the semiconductor and epitaxial layers, forming first source/drain regions on the semiconductor layer in the first region, and forming second source/drain regions on the silicon germanium layer in the second region and electrically isolated from the first region by the shallow trench isolation region.

A second exemplary method includes obtaining a substrate comprising a semiconductor layer that comprises crystalline silicon, an insulator layer beneath and adjoining the semiconductor layer, and an epitaxial layer comprising germanium on the thin semiconductor layer and having a substantially uniform thickness, the substrate including an nFET region for forming an nFET device and a pFET region for forming a pFET device. The method further includes removing a portion of the epitaxial layer from the semiconductor layer in the nFET region, forming a silicon germanium layer in the pFET region, and forming a shallow trench isolation region on the substrate. An nFET device is formed on the semiconductor layer in the nFET region and a pFET device is formed on the silicon germanium layer in the pFET region.

A structure provided in accordance with the principles of the present disclosure includes a substrate including a crystalline silicon germanium layer, first and second p-type source and drain regions on the silicon germanium layer, and a gate structure operatively associated with the first and second p-type source and drain regions and adjoining the silicon germanium layer such that a channel is formed in the silicon germanium layer near the gate structure. The first and second p-type source and drain regions, the gate structure and the silicon germanium layer comprise a pFET device. A shallow trench isolation region adjoins the silicon germanium layer. The silicon germanium layer has a substantially uniform thickness, having substantially the same thickness near the shallow trench isolation region as the remainder of the silicon germanium layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

CMOS structures and fabrication methods as disclosed herein can provide substantial beneficial technical effects.

For example, one or more embodiments may provide one or more of the following advantages:

Uniform silicon germanium layers for pFET structures;
Reduced variation and degradation of CMOS structures, particularly in narrow width devices;
Preventing lateral diffusion of germanium;

These and other features and advantages will become apparent from the following detailed description of illustrative embodiments thereof, which is to be read in connection with the accompanying drawings.

BRIEF DESCRIPTION OF THE DRAWINGS

FIG. 7 is a schematic top plan view thereof following fabrication of nFET and pFET structures on the substrate;

FIG. 8 is a sectional view of the structure shown in FIG. 7 taken along line 8-8 in FIG. 7;

FIG. 9 is a sectional view of the structure shown in FIG. 7 taken along line 9-9 in FIG. 7;

DETAILED DESCRIPTION

Reference is first made to FIGS. 1-9, which illustrate steps of a first exemplary method of fabricating a CMOS structure and an exemplary structure obtained using such a method.

Figure 1:
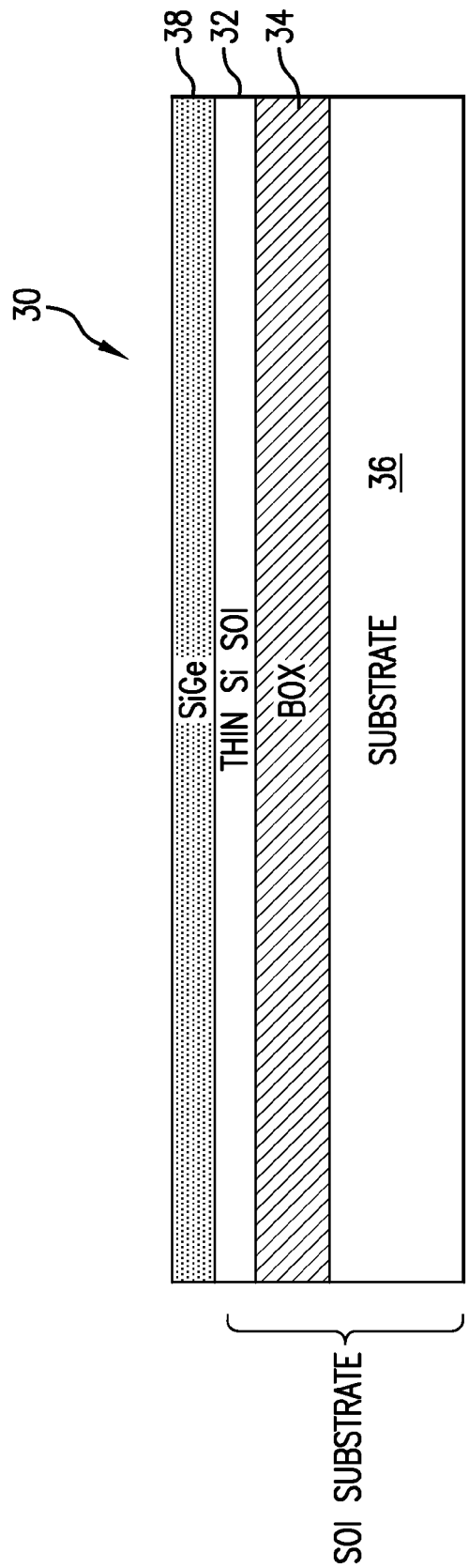
FIG. 1 is a schematic cross sectional illustration of a SOI substrate following blanket deposition of a silicon germanium layer thereon.

FIG. 1 illustrates a structure 30 including an ETSOI substrate including a crystalline silicon layer 32 (also referred to as an ETSOI layer) overlying an insulating layer 34 such as a buried oxide (BOX) layer. The ETSOI layer 32 has a thickness that is less than 30 nm and preferably less than 10 nm. While the ETSOI layer 32 in the exemplary embodiment is considered pure undoped silicon, in reality most or all commercially manufactured starting substrates are slightly p-doped in the 1e15 range if not stated otherwise. A semiconductor substrate layer 36 underlies the insulating layer 34. In one or more embodiments, the BOX layer has a thickness of about 25 nm while the substrate layer 36 is about 875 μm. The ETSOI layer 32 is made of a semiconducting material, namely crystalline silicon in the exemplary embodiment. The ETSOI layer 32 may be thinned to a desired thickness by planarization, grinding, wet etch, dry etch, oxidation followed by oxide etch, or any combination thereof, as known to those of skill in the art. One method of thinning the ETSOI layer 32 includes oxidizing silicon by a thermal dry or wet oxidation process, and then wet etching the oxide layer using preferably a hydrofluoric (HF) acid mixture. This process can be repeated to achieve the desired thickness. The ETSOI layer 32 is preferably less than 10 nm in thickness, and is 6 nm thick in an exemplary embodiment. The second semiconductor layer 36 is made of a semiconducting material including, but not limited to silicon (Si), strained Si, Si:C, SiGe, SiGe:C, Si alloys, Ge, Ge alloys, GaAs, InAs, InP as well as other III/V and II/VI compound semiconductors. The ETSOI substrate can be obtained from commercial sources or fabricated.

In accordance with an exemplary method, a germanium-containing layer such as a silicon germanium (SiGe) layer 38 is grown epitaxially on the silicon layer 32 using a blanket layer deposition process. "Blanket" deposition refers to the deposition of the layer without masking either of the portions of the substrate later used for nFET and pFET formation. Chemical vapor deposition (CVD) is among the known techniques for epitaxially depositing materials such as silicon germanium on crystalline silicon. In one embodiment, the silicon germanium layer contains about twenty-five percent (25%) germanium and has a thickness of about six nanometers. The germanium content of the silicon germanium layer 38 is between 10-100%, and preferably between 20-40%. The thickness of this layer 38 may be between 2-30 nm, but is preferably between four and ten nanometers (4-10 nm). The structure 30 shown in FIG. 1 is accordingly obtained.

Figure 2:
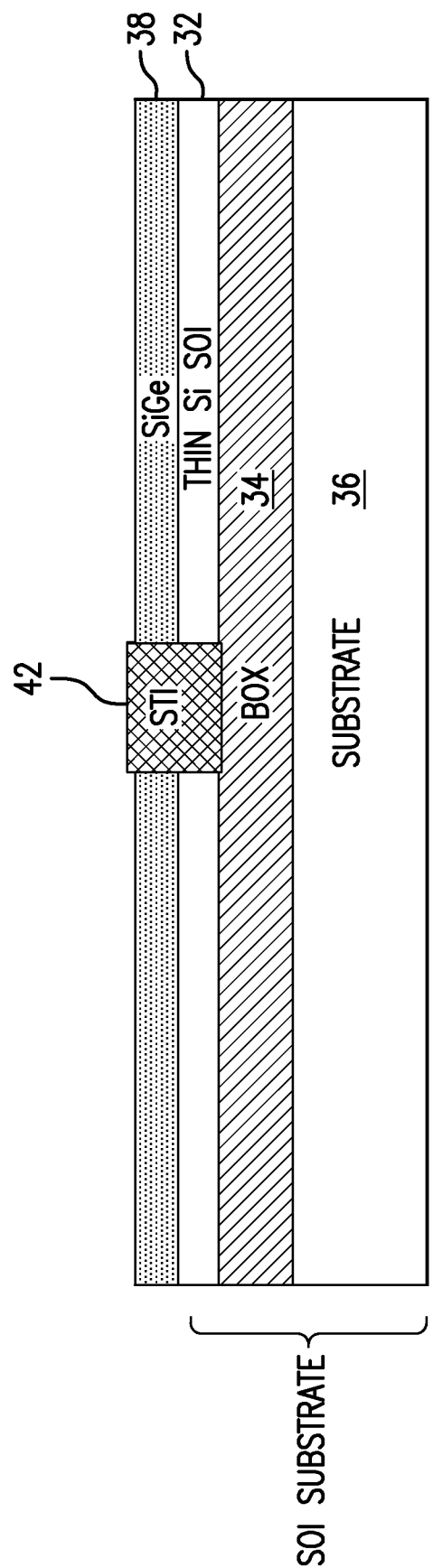
FIG. 2 is a schematic cross sectional view thereof following STI formation.

Referring to FIG. 2, silicon trench isolation (STI) provides a region 42 that electrically isolates active areas of the structure. A trench is formed in the structure 30, for example by etching, down to the BOX layer 34. Patterning techniques familiar to those in the art facilitate trench formation and subsequent filling of the trench with an electrically insulating material such as silicon dioxide. To prevent germanium diffusion, STI anneal is preferably performed later in the fabrication process. The thickness of the silicon germanium layer 38 remains uniform following silicon trench isolation, as shown in FIG. 2.

Figure 3:
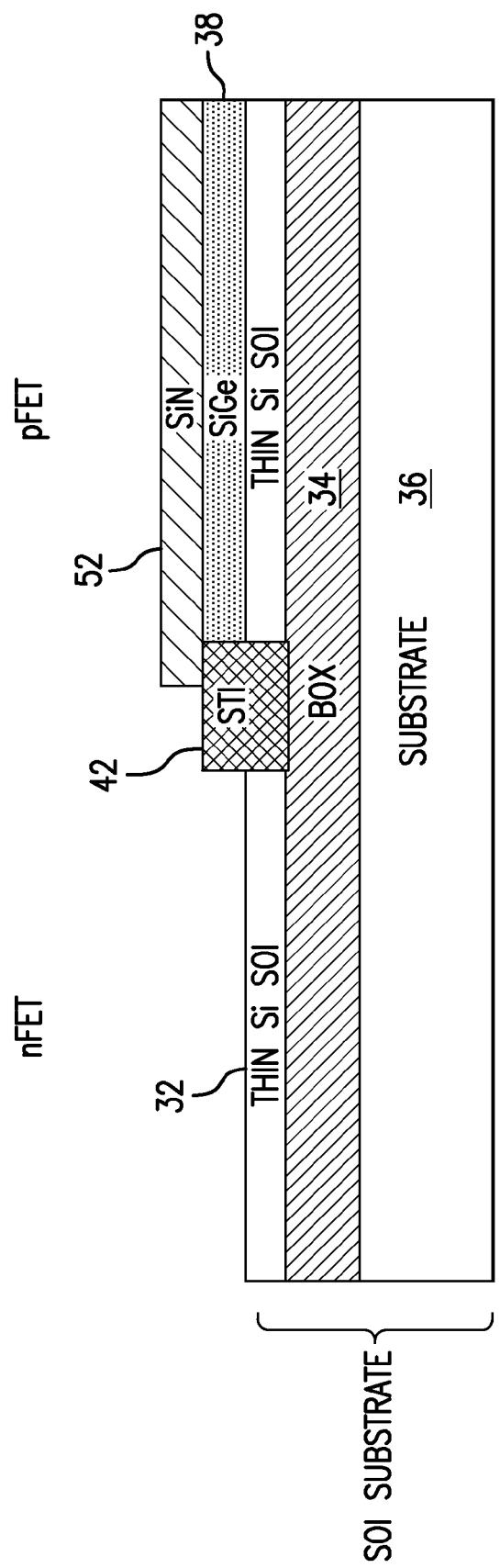
FIG. 3 is a schematic cross sectional view thereof following deposition of a hard mask, removal a portion of the hard mask, and removal of a portion of the silicon germanium layer.

The next steps of the exemplary method are discussed with respect to FIG. 3. A hard mask 52, for example a nitride layer (silicon nitride ($Si_3N_4$)), is deposited on the structure shown in FIG. 2. Conventional processes are employed, such as applying and patterning a resist, etching, and removing resist, to remove a portion of the nitride layer 52 from the region of the structure to be used as an nFET region. The silicon germanium layer 38 is accordingly exposed in the nFET region of the structure while remaining covered by the nitride layer in the pFET region thereof. The exposed portion of the silicon germanium layer is then removed, for example by SC1 etch, exposing the crystalline silicon layer 32 in the nFET region. The structure shown in FIG. 3 is thereby obtained.

Figure 4:
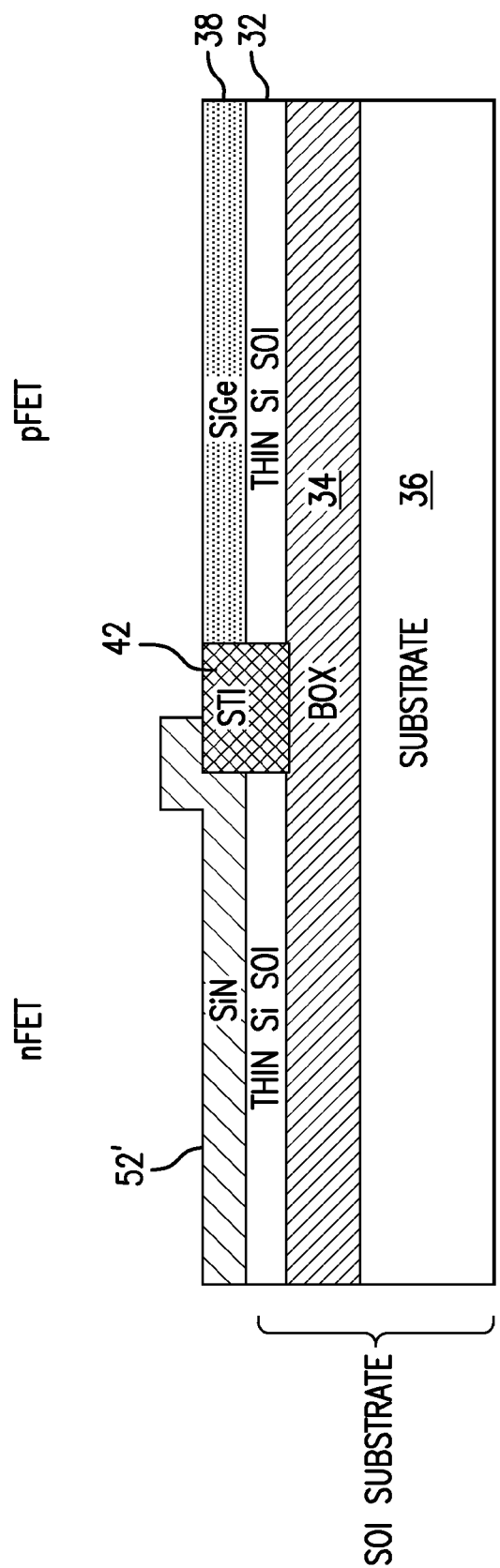
FIG. 4 is a schematic cross sectional view thereof following removal of the hard mask, deposition of a second hard mask, and removal of a portion of the second hard mask.

The remaining portion of the originally deposited nitride layer 52 is optionally removed once the structure of FIG. 3 is obtained. If silicon nitride is employed for the hard mask, it can be stripped by hot phosphoric acid or HF/EG (hydrofluoric acid/ethylene glycol), such stripping methods being familiar to those of skill in the art. A second hard mask 52', which may also be silicon nitride, is deposited on the structure. Patterning and etching techniques familiar to those of skill in the art are employed to remove a portion of the second hard mask, exposing the silicon germanium layer 38 in the pFET region of the structure. The structure shown in FIG. 4 is accordingly obtained.

Figure 5:
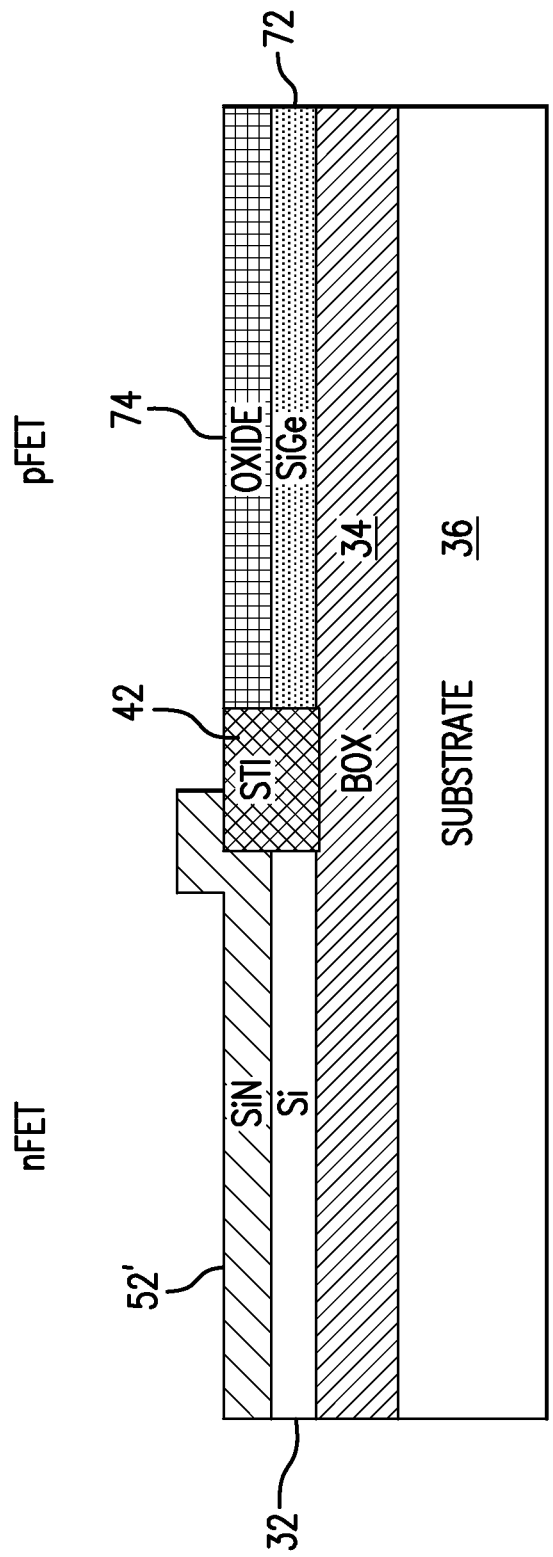
FIG. 5 is a schematic cross sectional view thereof following oxidation to convert the silicon germanium/silicon bi-layer into a silicon germanium layer.
Figure 6:
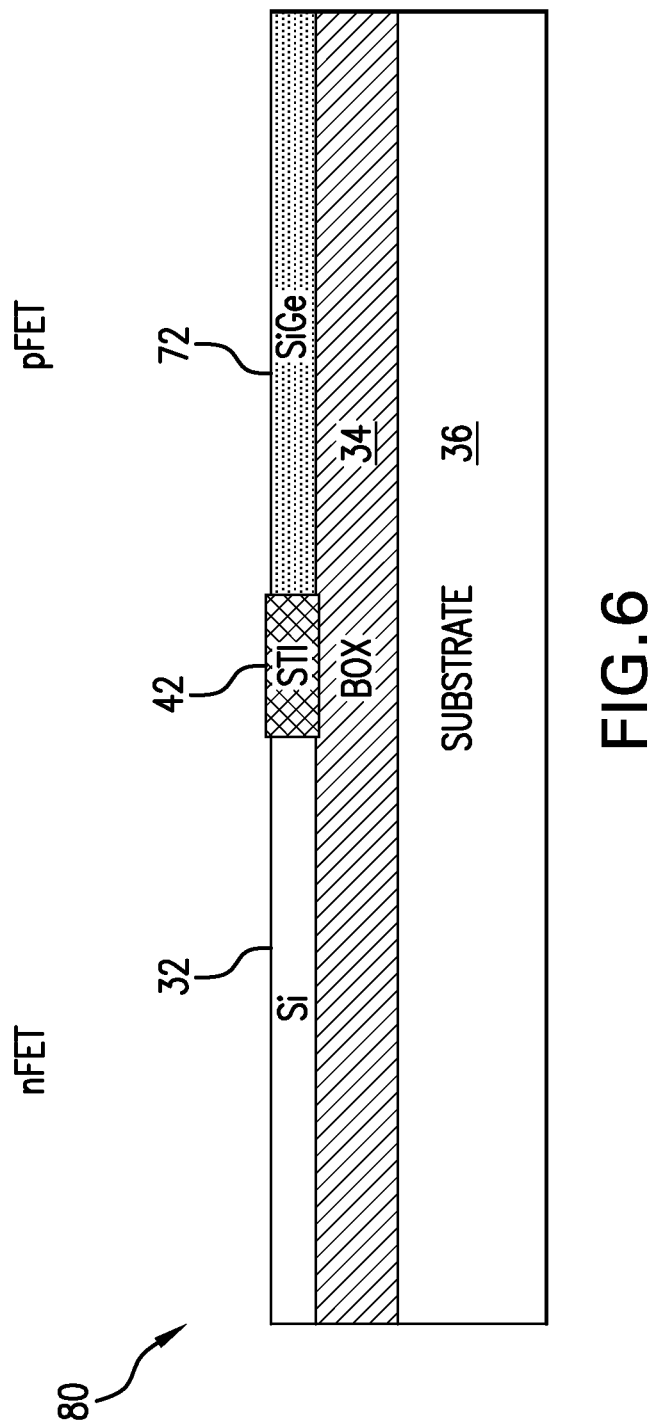
FIG. 6 is a schematic cross sectional view thereof following STI annealing and removal of the second hard mask and oxide layer.

Referring to FIG. 5, the silicon germanium/silicon bi-layer including layers 38 and 32 described above is converted into a silicon germanium layer 72. Such conversion may be performed by an oxidation process (for example, subjecting the structure to a temperature of 1050° C. for ten (10) minutes), which leaves the silicon germanium layer 72 covered by an oxide layer 74. Alternatively, thermal annealing can be employed to form the SiGe layer 72 from the SiGe/Si bi-layer. If thermal annealing is employed, anneal temperature ranges from 900-1200° C. and anneal time ranges from one second to three hours. The germanium content of the silicon germanium layer 72 can be engineered as desired for particular applications by depositing a germanium containing layer 38 having an appropriate germanium content and/or thickness for the particular applications. The nitride hard mask and oxide layer are removed, the nitride layer 52' being removed by hot phosphoric acid and the oxide layer removed by hydrofluoric acid in exemplary embodiments, leaving the structure 80 shown in FIG. 6.

Referring to FIGS. 7-9, conventional CMOS processing is employed to form nFET and pFET devices on the structure 80. In this exemplary embodiment, gates 92 and raised source/drain regions 94, 96 are formed on the structure 80 to provide a structure 90 including nFET and pFET devices electrically isolated by the STI regions 42. RSD regions 94, 96, shown only in FIG. 8, are grown epitaxially employing processing techniques familiar to those of skill in the art. Boron doped SiGe may be employed to form pFET structures while nFET structures can be formed using phosphorous or arsenic doped SiGe RSD regions in some exemplary embodiments. In another exemplary embodiment, the RSD regions 94 are comprised of SiC and doped with a group V element to form an nFET device.

The term "in-situ doped" means that the dopant that provides the conductivity of the raised source regions and raised drain regions is introduced during the epitaxial growth process that provides the semiconductor material of the raised source regions and the raised drain regions. The in-situ doped semiconductor material can be doped with a first conductivity type dopant during the epitaxial growth process. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. Ion implantation may be employed instead of in situ doping. U.S. Publication No. 2012/0061759 discloses suitable RSD materials and doping levels for some exemplary embodiments, and is incorporated by reference herein.

High-k material is formed on the structure 80 to provide spacers 98 and gate dielectric layers 100. High-k dielectric material having a dielectric constant (k value) greater than, for example, 3.9, which is the dielectric constant of silicon dioxide, may be employed. The high-k dielectric material may include a dielectric metal oxide. In some implementations, a high-k material that has a dielectric constant in the range of about 4.0-8.0 may be utilized. Exemplary high-k dielectric materials may include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, or $Y_2O_xN_y$. In other implementations, a silicon nitride ($Si_3N_4$) dielectric material having a dielectric constant of about 7.5 may be used as the spacer and gate dielectric materials. The gate dielectric layers 100, i.e. the layers between the gate metals comprising the gate electrodes 92 and the ETSOI layer 32 or the silicon germanium layer 72, may also include a multi-layer of $SiO_2$, SiON, SiN, and a high-k dielectric material, including but not limited to hafnium oxide ($HfO_2$), aluminum oxide ($Al_2O_3$), lanthanum oxide ($La_2O_3$), zirconium oxide ($ZrO_2$), and their respective silicates. The thickness of the gate dielectric may be in the range of 1.0 nm-5.0 nm. The spacers 98 and gate dielectric layers 100 may be formed by using a blanket layer deposition and an anisotropic etchback method. The material for the spacers 98 may be deposited using any deposition method, e.g., chemical vapor deposition.

The gate electrode layers 92 are deposited on the structure 80 by PVD, ALD, CVD or other suitable processes known to those of skill in the art. Excess gate material can be removed by etching or other subtractive process. The gate electrodes may be comprised of metals such as TiN, TaN, W, WN, TaAlN, Al, Au, Ag, or a combination of such metals. Gate electrode layers may also include a poly-silicon layer located on top of a metal material, whereby the top of the poly-silicon layer may be silicided. Gate electrodes may have thicknesses approximately in the range of 20-100 nm and lengths in the range of about 10-250 nm, although lesser and greater thicknesses and lengths may also be contemplated.

The resulting structure 90 is shown in FIG. 8. RSD regions are omitted from FIG. 7 to more clearly show the silicon germanium and silicon layers 72, 32 on which the pFET and nFET structures are respectively formed. Contact layers (not shown) such as metal silicide layers fabricated in accordance with salicide processing technology familiar to those of skill in the art are provided on the RSD regions to complete the FET structures shown in FIGS. 7-9. It will be appreciated by those of skill in the art that any suitable process may be employed to form nFET and pFET structures on the structure 80 wherein the pFET structures are advantageously formed on a silicon germanium layer having substantially constant thickness.

In contrast to the silicon germanium layer obtained in prior art structures wherein thinning of the layer is noticeable at the RX edge and adversely impacts device performance, the layer 72 shown in FIG. 8 has a substantially uniform thickness. The provision of a thin silicon germanium channel for a pFET structure that is substantially uniform across the device width is beneficial for device performance in comparison to structures wherein the silicon germanium layer thins appreciably at the RX edge. Channel film thickness has a strong effect on device characteristics of thin film channel field effect transistors. Because the silicon germanium layer 72 near the STI region 42 is substantially the same in thickness as the remainder of the layer 72, variation of device characteristics (such as threshold voltage) found in prior art devices characterized by faceted epitaxy is minimized.

A second exemplary process flow is shown schematically in FIGS. 10-13. In contrast to the first exemplary process discussed above, an SiGe/Si bi-layer is converted into a single SiGe layer in the pFET region prior to STI formation in this exemplary process. A structure 30 as shown in FIG. 1 is first obtained. In one exemplary embodiment of the second exemplary process, the silicon SOI layer 32 has a thickness of about six nanometers and the BOX layer has a thickness of about twenty-five nanometers. A blanket deposition process is employed to epitaxially grow the silicon germanium layer 38 on the substrate. A hard mask 52 (for example, silicon nitride or silicon nitride on silicon oxide) is deposited on the silicon germanium layer 38. In one exemplary embodiment, the hard mask is a silicon nitride hard mask having a thickness of about six nanometers. Using conventional patterning and etching techniques, a portion of the hard mask is removed to expose the silicon germanium in the nFET region of the structure. The exposed portion of the silicon germanium layer is then etched to expose the silicon layer 32 in the nFET region, resulting in the structure 140 shown in FIG. 10. SC1 etching is one exemplary process that can be used to remove the portion of the silicon germanium layer 38 in the nFET region.

The remaining portion of the hard mask 52 can be optionally stripped from the structure 140. If silicon nitride is employed for the hard mask, it can be stripped by hot phosphoric acid or HF/EG (hydrofluoric acid/ethylene glycol). A second hard mask 52' is deposited on the structure, forming the structure 150 shown in FIG. 11. Silicon nitride may be deposited to form the second hard mask 52'. The thickness of the second hard mask is about six nanometers in an exemplary embodiment.

Figure 12:
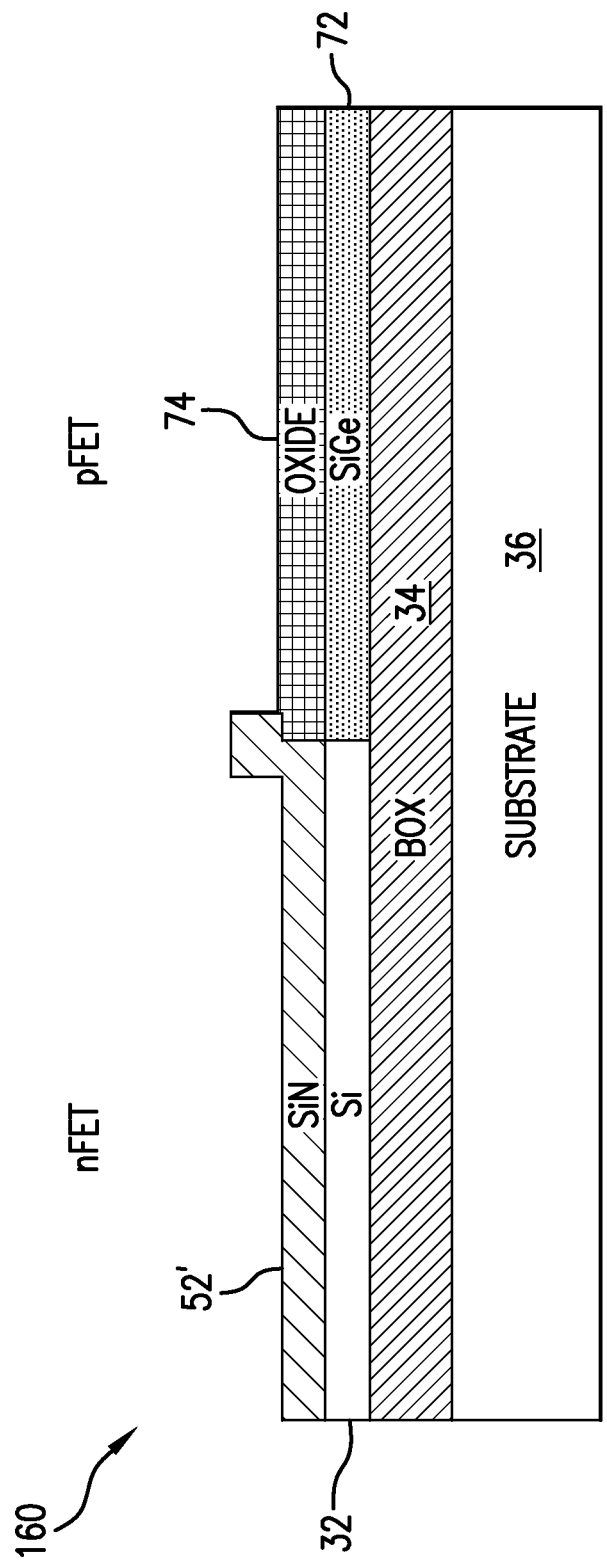
FIG. 12 is a schematic cross sectional illustration thereof following removal of a portion of the second hard mask and oxidation to convert the silicon germanium/silicon bi-layer into a silicon germanium layer.

The portion of the second hard mask 52' on the silicon germanium layer 38 is removed to expose this layer in the pFET region of the structure. An oxidation process, such as described above with respect to FIG. 5, is performed to convert the SiGe/Si bi-layer 38/32 into a SiGe layer 72 in the region labeled pFET as shown in FIG. 12. The resulting structure 160, shown in FIG. 12, includes a pFET region comprising a silicon germanium layer 72 on the BOX layer 34 and an oxide layer 74 on the silicon germanium layer 72. Alternatively, thermal annealing can be performed instead of oxidation to convert the layer adjoining the BOX layer 34 to a silicon germanium layer 72.

Figure 13:
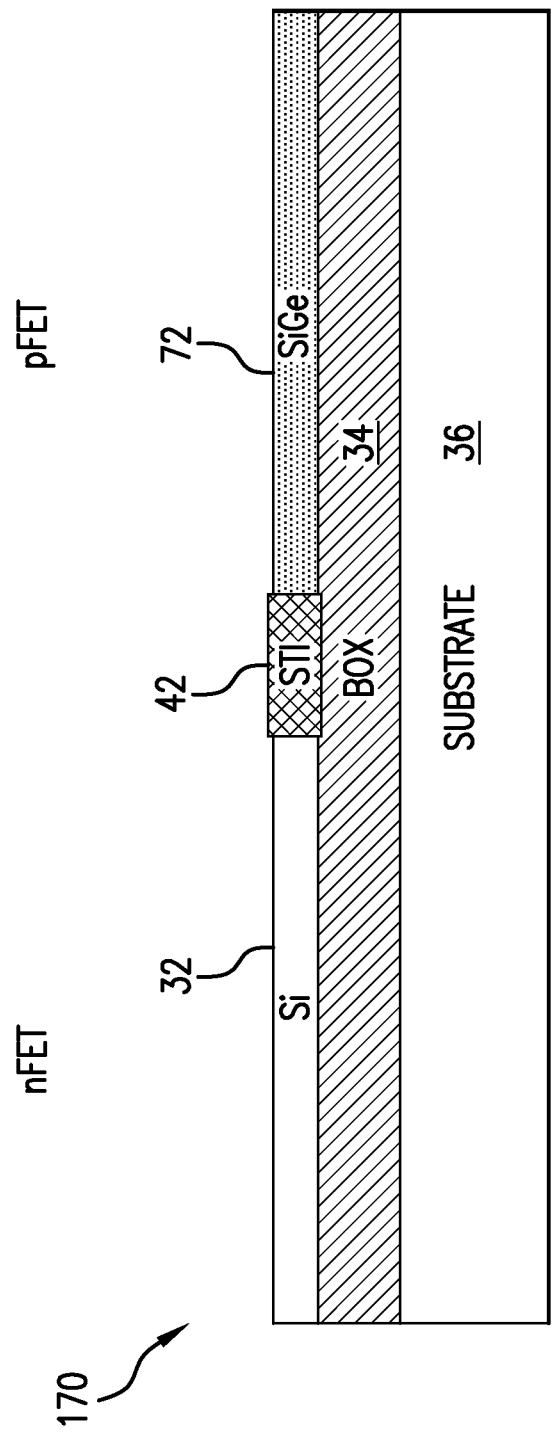
FIG. 13 is a schematic cross sectional illustration thereof following removal of the second hard mask, removal of the oxide layer from the silicon germanium layer, and shallow trench isolation.

The remaining portion of the second hard mask 52' and the oxide layer 74 are stripped from the structure 160 as described above with respect to the first exemplary method. This process is followed by a shallow trench isolation process to form the STI region 42. As discussed above, STI involves etching the substrates on which the FET structures are formed and filling the trenches with an insulating material such as silicon dioxide. In the exemplary embodiment, the adjoining silicon and silicon germanium layers 32, 72 are patterned and etched down to the BOX layer 34. STI etch can be performed by RIE (reactive ion etch). The resulting trench is filled with an insulating material that electrically isolates the silicon germanium layer on which the pFET structure is formed from the silicon layer 32 on which the nFET structure is formed. Shallow trench isolation is followed by annealing. An exemplary structure 170 resulting from the process is shown in FIG. 13. The structure 170 may be substantially the same as the structure 80 formed using the first exemplary process. The silicon germanium layer 72 of the structure 170 has a substantially uniform thickness and thereby substantially or entirely avoids the adverse effects of non-uniform layer thickness at the edge of the active area. Device formation, such as described with respect to FIGS. 7-9, may follow once the structure 170 has been obtained.

A third exemplary process is described with respect to FIGS. 14-17 The third exemplary process is similar to the second exemplary process described above except the step of converting the SiGe/Si bi-layer into SiGe is accomplished following shallow trench isolation. The prevention of the lateral diffusion of germanium in structures including SiGe pFET structures and Si nFET structures is desirable. Such pFET and nFET structures can be spaced very closely in some devices, for example SRAM devices. The second exemplary process is, for example, feasible with nFET/pFET spacing greater than forty nanometers. The third exemplary process, described in further detail below, provides further process margin.

Figure 14:
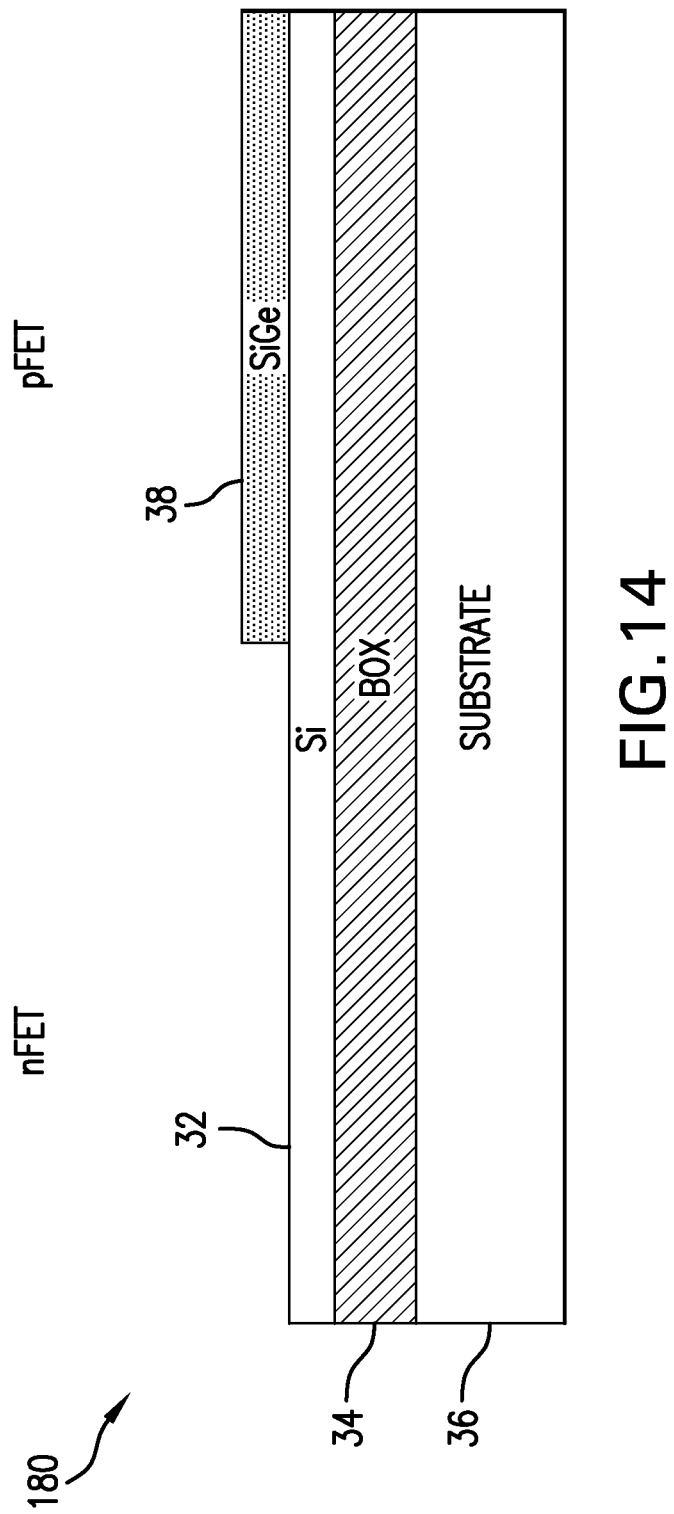
FIG. 14 is a schematic cross sectional illustration of a SOI substrate following blanket deposition of a silicon germanium layer thereon, deposition of a hard mask, partial removal of the hard mask, removal of part of the silicon germanium layer, and removal of the remaining portion of the hard mask.

The third exemplary process includes the blanket deposition of silicon germanium on the crystalline silicon layer of an ETSOI substrate, as shown in FIG. 1, followed by removal of the portion of the silicon germanium layer from the region identified as nFET in FIG. 14. The process for such removal may be the same as that described above with respect to the second exemplary process. The structure 180 shown in FIG. 14 can be obtained following removal of the first hard mask 52 shown in FIG. 10.

Figure 15:
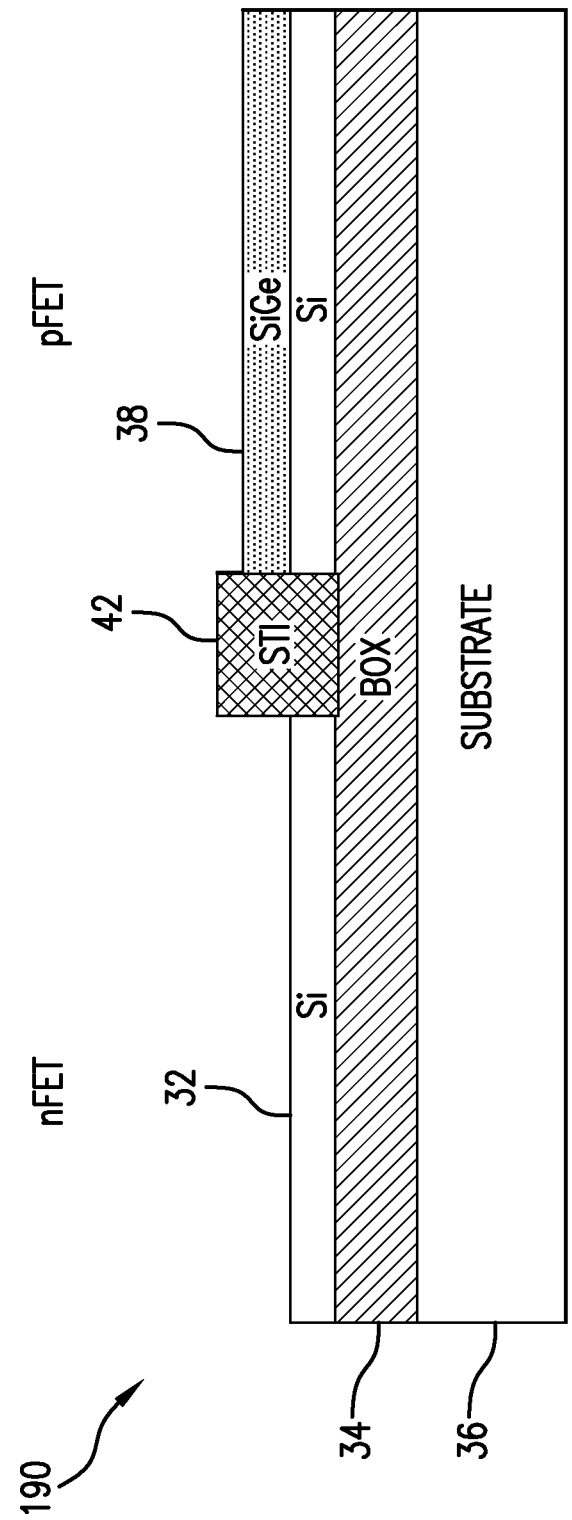
FIG. 15 is a schematic cross sectional illustration thereof following shallow trench isolation.
Figure 16:
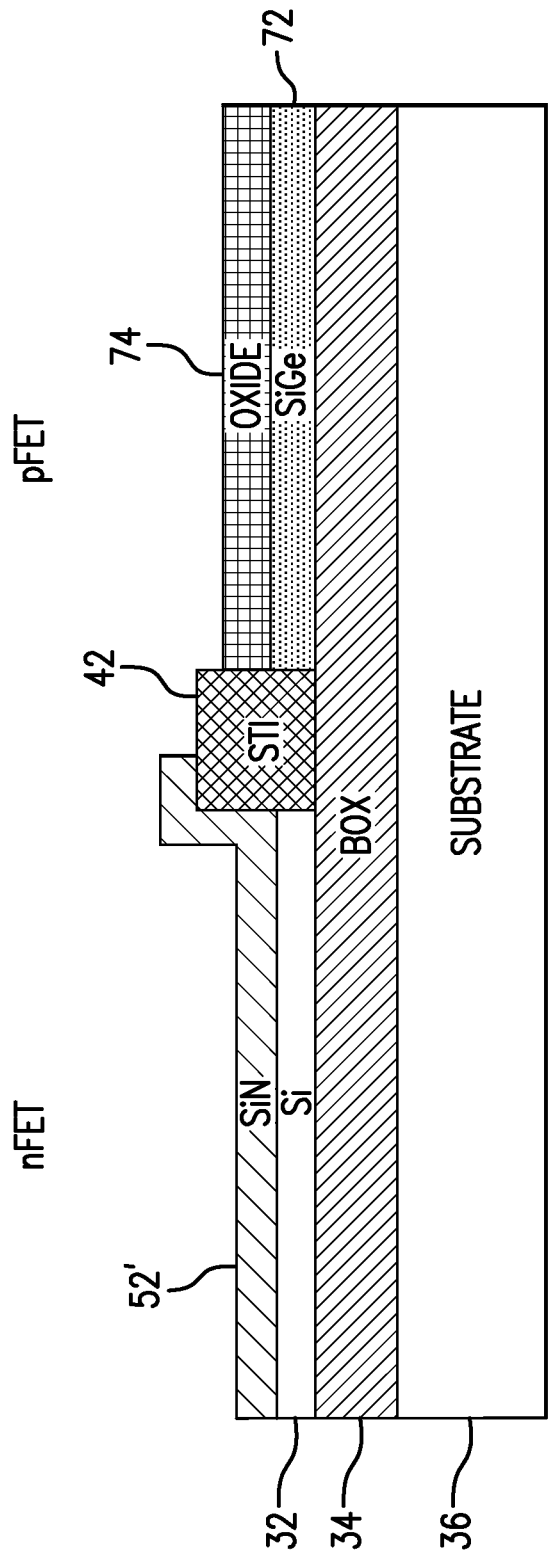
FIG. 16 is a schematic cross sectional illustration thereof following formation of a second hard mask and oxidation to convert the silicon germanium/silicon bi-layer into a single silicon germanium layer, and FIG. 17 a schematic cross sectional illustration thereof following removal of the second hard mask and removal of the oxide layer.
Figure 17:
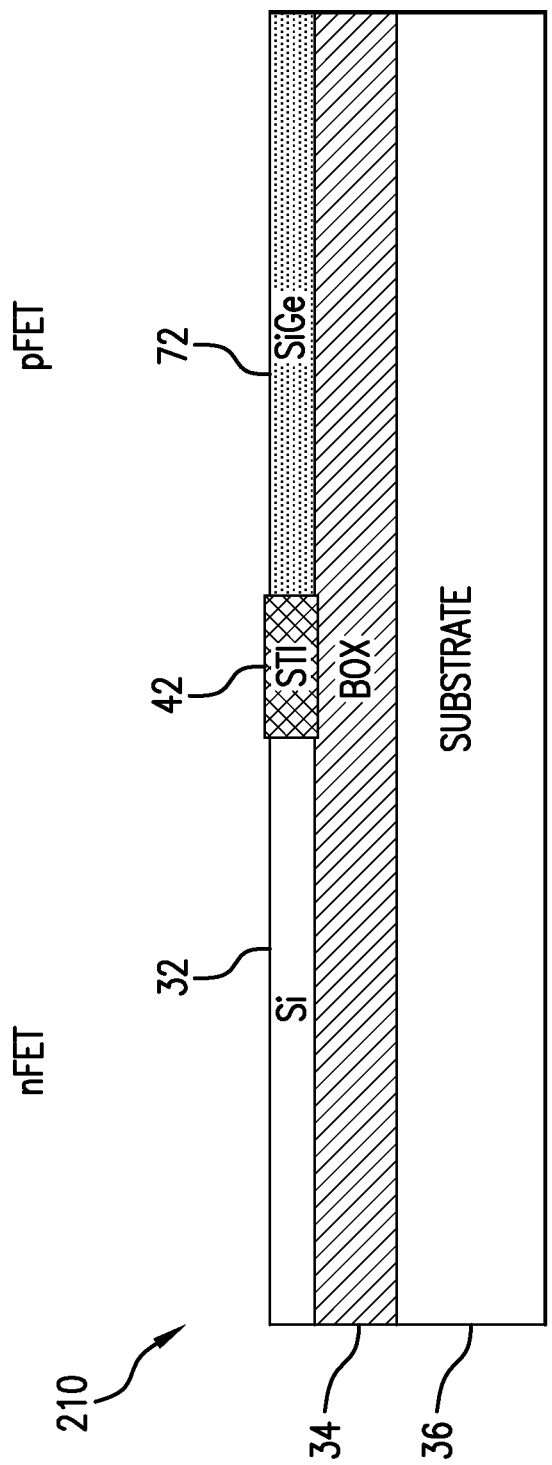

Shallow trench isolation is provided once the structure shown in FIG. 14 is obtained, resulting in the formation of the STI region 42 between regions labeled nFET and pFET in FIG. 15. While the schematic illustration of the structure 190 shown in FIG. 15 appears to show a large difference in height between nFET and pFET regions, the difference is actually small in that, in the exemplary embodiment, the thickness of the SiGe layer 38 is less than ten nanometers and is only about six nanometers in one specific exemplary embodiment. A hard mask 52' is formed over the structure 190, patterned and etched so that the remaining portion of the hard mask 52' covers the nFET region of the structure. Oxidation or thermal annealing is employed to convert the SiGe/Si bi-layer 38, 32 into a single SiGe layer 72 on the BOX layer 34 as shown in FIG. 16. The hard mask 52' and oxide layer 74 are stripped from the structure shown in FIG. 16 to form the structure 210 shown in FIG. 17. This structure 210 is similar to the structure 170 shown in FIG. 13 and can be further processed in the same manner to form the exemplary structures shown in FIGS. 7-9.

Figure 10:
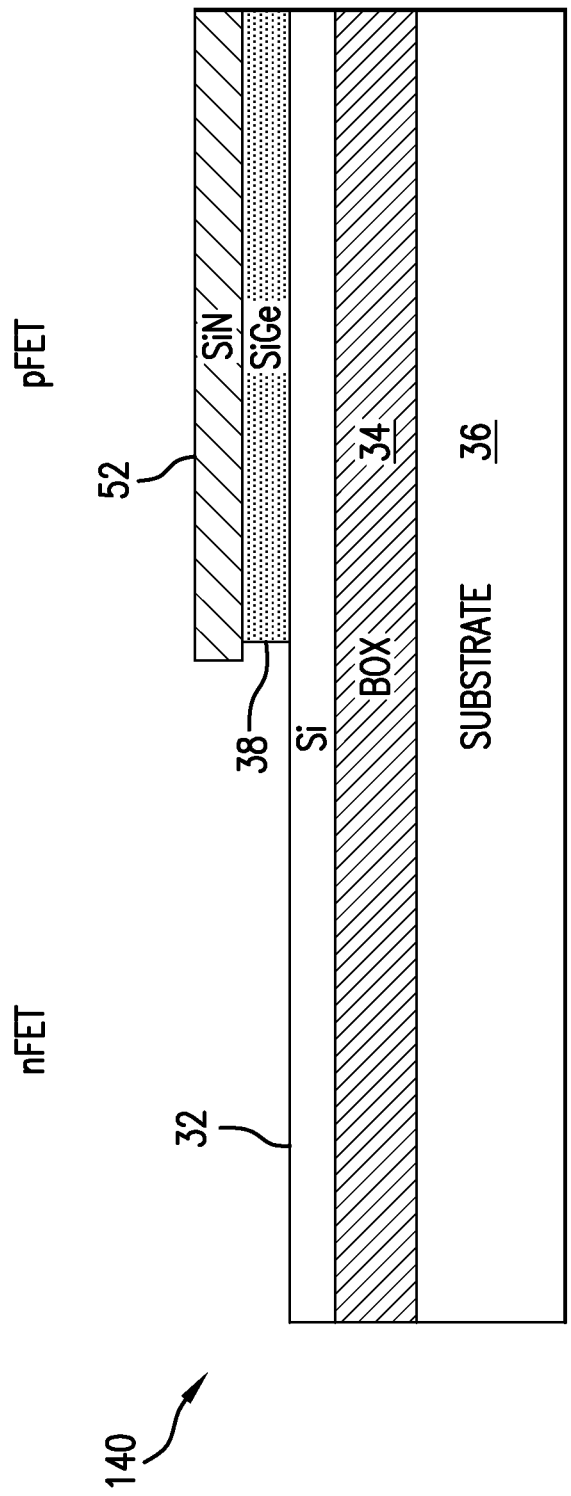
FIG. 10 is a schematic cross sectional illustration of a SOI substrate following blanket deposition of a silicon germanium layer thereon, deposition of a hard mask, partial removal of the hard mask, and removal of part of the silicon germanium layer.
Figure 11:
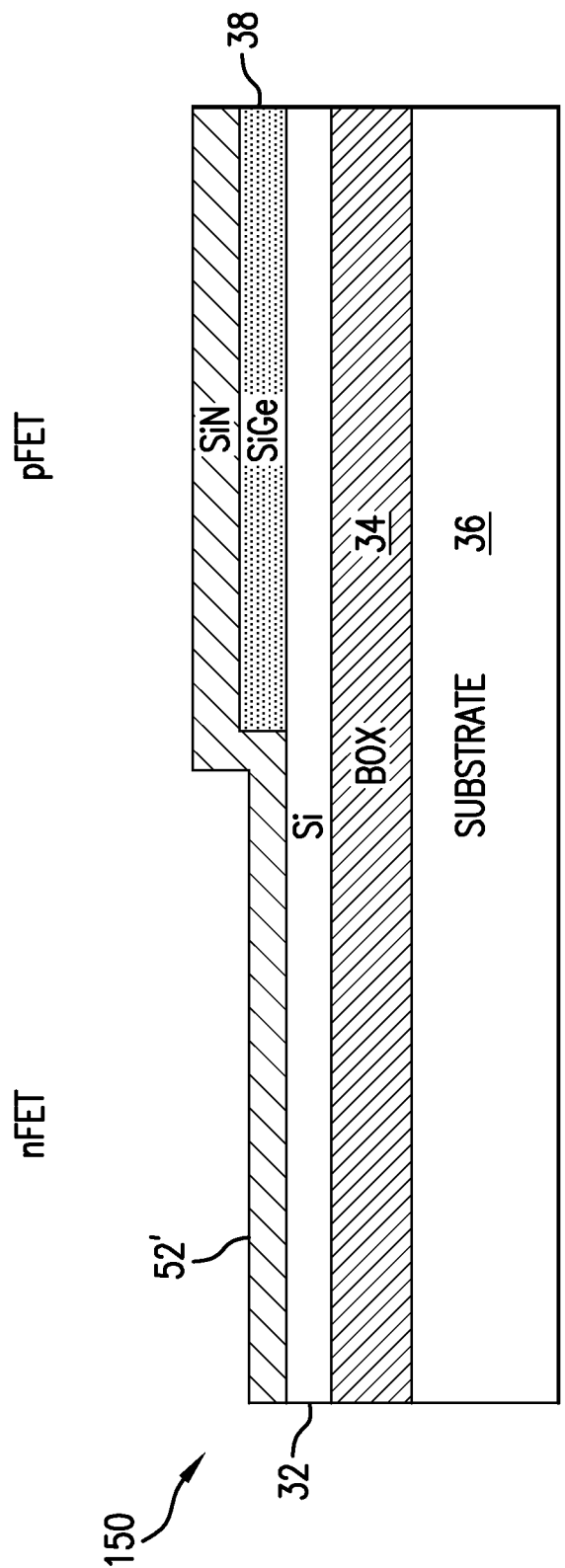
FIG. 11 is a schematic cross sectional illustration of the structure shown in FIG. 10 following optional removal of the hard mask and deposition of a second hard mask.

Given the discussion thus far and with reference to the exemplary embodiments discussed above and the drawings, it will be appreciated that, in general terms, an exemplary fabrication method includes obtaining a semiconductor on insulator substrate comprising a thin (less than thirty nanometers in thickness) semiconductor layer 32 that comprises crystalline silicon. A layer 38 comprising germanium is grown epitaxially on the semiconductor layer 32 as shown in FIG. 1. A portion of the layer 38 comprising germanium is removed from the semiconductor layer to form a first region wherein the semiconductor layer 32 is uncovered by the layer 38 comprising germanium and a second region wherein the semiconductor layer is covered by the layer comprising germanium. The first and second regions are designated as nFET and pFET regions, respectively, as with further processing they facilitate the formation of nFET and pFET devices. FIGS. 3, 10 and 14 are illustrative of structures having regions designated as nFET and pFET following removal of portions of the germanium containing layer 38. The method further includes forming a silicon germanium layer in the second (pFET) region from the semiconductor and epitaxial layers, such as described above with respect to FIGS. 5, 12 and 16. A shallow trench isolation region 42 is formed on the substrate subsequent to epitaxially growing the layer comprising germanium. FIGS. 2, 13 and 15 show different stages in the fabrication process in which the shallow trench isolation region 42 can be formed. First source/drain regions 94 are formed on the semiconductor layer 32 in the first (nFET) region, as shown in FIG. 8. Second source/drain regions 96 are formed on the silicon germanium layer 72 in the second (pFET) region and electrically isolated from the first region by the shallow trench isolation region 42. The semiconductor layer 32 and the epitaxial layer 38 each has a thickness of ten nanometers or less in one or more embodiments. In one or more embodiments of the exemplary method, the epitaxial layer 38 comprises silicon germanium.

A second exemplary method includes obtaining a substrate comprising a semiconductor layer that comprises crystalline silicon, an insulator layer beneath and adjoining the thin semiconductor layer, and an epitaxial layer comprising germanium on the thin semiconductor layer, the substrate including an nFET region for forming an nFET device and a pFET region for forming a pFET device. Such as substrate is shown in FIG. 1. A portion of the epitaxial layer is removed from the thin semiconductor layer in the nFET region. A silicon germanium layer is formed in the pFET region from the semiconductor and epitaxial layers. A shallow trench isolation (STI) region 42 is formed on the substrate. The thin semiconductor layer 32 and the germanium-containing epitaxial layer 38 are already present, either separately as shown in FIG. 1 or as processed to form the silicon germanium layer 72 as shown in FIG. 12 when the STI region is formed. The thickness of the silicon germanium layer 72 of the resulting structure has been found to be substantially uniform, facilitating its function as a channel in a narrow width FET. The exemplary method further includes forming an nFET device on the thin semiconductor layer in the nFET region and forming a pFET device on the silicon germanium layer in the pFET region. FIG. 8 shows exemplary nFET and pFET devices.

An exemplary structure provided in accordance with the disclosure includes a substrate including a crystalline silicon germanium layer and first and second p-type source and drain regions on the silicon germanium layer. A gate structure is operatively associated with the first and second p-type source and drain regions and adjoins the silicon germanium layer such that a channel is formed in the silicon germanium layer near the gate structure. The first and second p-type source and drain regions, the gate structure and the silicon germanium layer comprise a pFET device, such as shown in the exemplary embodiment of FIG. 8. The structure further includes a shallow trench isolation region adjoining the silicon germanium layer, the silicon germanium layer having a substantially uniform thickness such that the thickness of the layer 72 near the STI region 42 is substantially the same as the remainder of the layer.

Those skilled in the art will appreciate that the exemplary structures discussed above can be distributed in raw form or incorporated as parts of intermediate products or end products that benefit from having CMOS devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
   obtaining a semiconductor on insulator substrate comprising a semiconductor layer that comprises crystalline silicon;
   epitaxially growing a layer comprising germanium on the semiconductor layer;
   removing a portion of the layer comprising germanium from the semiconductor layer to form a first region wherein the semiconductor layer is uncovered by the layer comprising germanium and a second region wherein the semiconductor layer is covered by the layer comprising germanium;
   forming a silicon germanium layer in the second region from the semiconductor layer and the epitaxially grown layer comprising germanium;
   forming a shallow trench isolation region on the substrate subsequent to epitaxially growing the layer comprising germanium;
   forming first source/drain regions on the semiconductor layer in the first region, and
   forming second source/drain regions on the silicon germanium layer in the second region and electrically isolated from the first region by the shallow trench isolation region.

2. The method of claim 1, wherein the layer comprising germanium comprises silicon germanium, further including the step of forming a first gate structure on the semiconductor layer in the first region and a second gate structure on the silicon germanium layer in the second region, wherein the first source/drain regions and first gate structure comprise an nFET structure and the second source/drain regions and second gate structure comprise a pFET structure.

3. The method of claim 2, wherein the first and second source/drain regions comprise raised source/drain regions.

4. The method of claim 1, wherein the step of forming the shallow trench isolation region is performed prior to the step of removing the portion of the layer comprising germanium from the semiconductor layer to form the first region.

5. The method of claim 1, wherein the step of forming the shallow trench isolation region is performed subsequent to the step of removing the portion of the layer comprising germanium from the semiconductor layer to form the first region.

6. The method of claim 1, wherein the step of forming the shallow trench isolation region is performed subsequent to the steps of removing the portion of the layer comprising germanium from the semiconductor layer to form the first region and forming the silicon germanium layer in the second region.

7. The method of claim 1, wherein the step of forming the shallow trench isolation region is performed subsequent to the step of removing the portion of the layer comprising germanium from the semiconductor layer to form the first region and prior to forming the silicon germanium layer in the second region.

8. The method of claim 7, further including the step of forming a mask on the first region prior to forming the silicon germanium layer in the second region and removing the mask from the first region following forming the silicon germanium layer.

9. The method of claim 1, wherein the semiconductor layer has a thickness of ten nanometers or less.

10. The method of claim 9, wherein the layer comprising germanium comprises silicon germanium having a thickness of ten nanometers or less.

11. The method of claim 10, further wherein the step of forming the silicon germanium layer includes oxidation of the germanium containing layer.

12. A method comprising:
  obtaining a substrate comprising a semiconductor layer that comprises crystalline silicon, an insulator layer beneath and adjoining the semiconductor layer, and an epitaxial layer comprising germanium on the semiconductor layer, the substrate including an nFET region for forming an nFET device and a pFET region for forming a pFET device;
  removing a portion of the epitaxial layer from the semiconductor layer in the nFET region;
  forming a silicon germanium layer in the pFET region from the semiconductor and epitaxial layers;
  forming a shallow trench isolation region on the substrate subsequence to the obtaining step;
  forming an nFET device on the semiconductor layer in the nFET region, and
  forming a pFET device on the silicon germanium layer in the pFET region.

13. The method of claim 12, wherein the epitaxial layer comprises silicon germanium, and further wherein the step of forming the shallow trench isolation region is performed prior to the step of removing the portion of the epitaxial layer from the nFET region.

14. The method of claim 12, wherein the epitaxial layer comprises silicon germanium, and further wherein the step of forming the shallow trench isolation region is performed subsequent to the step of removing the portion of the epitaxial layer from the nFET region.

15. The method of claim 12, wherein the epitaxial layer comprises silicon germanium, and further wherein the step of forming the shallow trench isolation region is performed subsequent to the steps of removing the portion of the epitaxial layer from the nFET region and forming the silicon germanium layer in the pFET region.

16. The method of claim 12, wherein the step of forming the shallow trench isolation region is performed subsequent to the step of removing the portion of the epitaxial layer from the thin semiconductor layer in the nFET region and prior to forming the silicon germanium layer in the pFET region.

17. The method of claim 12, wherein the semiconductor layer and the epitaxial layer each has a thickness of ten nanometers or less.

\* \* \* \* \*